(12) United States Patent
Suh (10) Patent No.: US 9,076,866 B2
(45) Date of Patent: Jul. 7, 2015

(54) SEMICONDUCTOR DEVICE AND METHOD FOR FABRICATING THE SAME

(71) Applicant: SK hynix Inc., Gyeonggi-do (KR)

(72) Inventor: Jun Kyo Suh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/156,187

(22) Filed: Jan. 15, 2014

(65) Prior Publication Data

US 2015/0091081 A1 Apr. 2, 2015

(30) Foreign Application Priority Data

Sep. 27, 2013 (KR) .................. 10-2013-0115012

(51) Int. Cl.
| | | |
|---|---|---|
| *H01L 21/00* | (2006.01) | |
| *H01L 29/00* | (2006.01) | |
| *H01L 29/78* | (2006.01) | |
| *H01L 29/66* | (2006.01) | |
| *H01L 21/768* | (2006.01) | |
| *H01L 29/417* | (2006.01) | |
| *H01L 21/265* | (2006.01) | |

(52) U.S. Cl.
CPC ...... *H01L 29/7827* (2013.01); *H01L 29/66666* (2013.01); *H01L 21/76865* (2013.01); *H01L 21/26586* (2013.01); *H01L 29/41741* (2013.01); *H01L 29/665* (2013.01)

(58) Field of Classification Search
CPC .................. H01L 21/76877; H01L 27/10823; H01L 27/10876; H01L 29/42336; H01L 29/42366; H01L 29/7827; H01L 29/6666; H01L 21/76865
USPC .................................................. 438/259, 270
See application file for complete search history.

(56) References Cited

U.S. PATENT DOCUMENTS

| 6,802,719 B2* | 10/2004 | Finney .......................... 438/270 |
|---|---|---|
| 2005/0280079 A1* | 12/2005 | Jones ............................ 257/330 |
| 2008/0070365 A1* | 3/2008 | Park .............................. 438/270 |

FOREIGN PATENT DOCUMENTS

| KR | 100618875 | 9/2006 |
|---|---|---|
| KR | 1020120069311 | 6/2012 |

\* cited by examiner

*Primary Examiner* — Victor A Mandala
*Assistant Examiner* — Quovaunda V Jefferson
(74) *Attorney, Agent, or Firm* — IP & T Group LLP (57) ABSTRACT

A semiconductor device includes a semiconductor substrate including a plurality of pillars, a gate electrode formed to surround a lower portion of the pillar and having a top surface lower than a top surface of the pillar, a salicide layer formed to cover the top surface of the pillar and surround an upper portion of the pillar, and an electrode formed to cover a top surface and a lateral surface of the salicide layer.

10 Claims, 11 Drawing Sheets

SEMICONDUCTOR DEVICE AND METHOD FOR FABRICATING THE SAME

CROSS-REFERENCES TO RELATED APPLICATION

This application claims priority under 35 U.S.C. 119(a) to Korean application No. 10-2013-0115012, filed on Sep. 27, 2013, in the Korean intellectual property Office, which is incorporated by reference in its entirety as set forth in full.

BACKGROUND

1. Technical Field

Various exemplary embodiments of the inventive concept relate to a semiconductor device and a method for fabricating the same, and more particularly, to a semiconductor device having a vertical channel transistor and a method for fabricating the same.

2. Related Art

With increase in the integration degree of semiconductor devices, a channel length of transistors is increasingly reduced. Short channel effects such as Drain Induced Barrier Lowering (DIBL), a hot carrier effect, and a punch through are caused due to the reduction in the channel length.

As various methods of preventing such effects from being caused, methods of increasing a channel length by reducing a length of a junction region or by forming a recess in a channel region of a transistor are suggested.

However, as the integration degree of the semiconductor devices is approaching Giga bits, it is difficult to satisfy the restricted device area in a flat transistor structure in which junction regions are formed at both sides of a gate electrode even when the channel length thereof is scaled down. Therefore, a vertical channel transistor is suggested.

Figure 1:
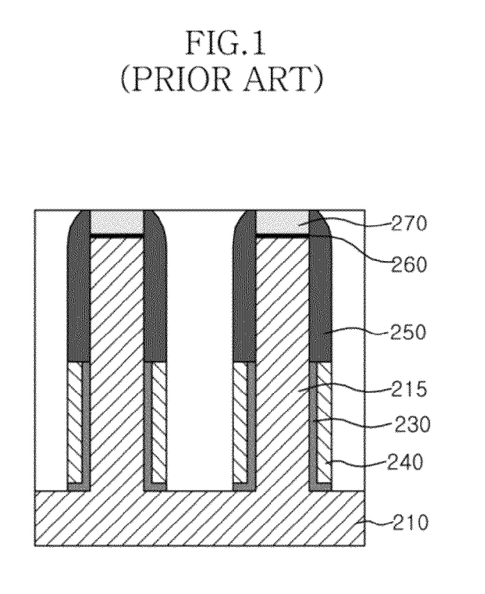
FIG. 1 is a cross-sectional view illustrating a semiconductor device in the related art.

A semiconductor device having a vertical channel transistor in the related art will be described with reference to FIG. 1.

The semiconductor device in the related art includes a plurality of pillars 215 vertically extending, that is, protruding from a semiconductor substrate 210, a gate insulating layer 230 surrounding a lateral surface of each pillar 215, and a gate electrode 240 surrounding each pillar 215 surrounded with the gate insulating layer 230 with a predetermined height. A silicide layer 260 is formed on a top surface of the pillar 215, and an electrode 270 is formed on the silicide layer 260.

With scaling down in the semiconductor device having the vertical channel transistor, specifically, a phase-change random access memory (PCRAM), the level of difficulty in a process is seriously increased. In particular, in the semiconductor device of 20 nm grade or less, ON current is reduced by increase in a contact resistance due to the scaling down.

Therefore, there is a need for a method for increasing ON current by reducing a contact resistance.

SUMMARY

One or more exemplary embodiments of the present invention are provided to a semiconductor device capable of increasing ON current by reducing a contact resistance in fabricating the semiconductor device, and a method for fabricating the same.

According to an embodiment, there is provided a semiconductor device. The semiconductor device may include a semiconductor substrate including a plurality of pillars, a gate electrode formed to surround a lower portion of each pillar and having a top surface lower than a top surface of the pillar, a self-aligned silicide (salicide) layer formed to cover the top surface of the pillar and surround an upper portion of the pillar, and an electrode formed to cover a top surface and a lateral surface of the salicide layer.

According to another embodiment, there is provided a method of fabricating a semiconductor device. The method may include forming a plurality of pillars in the semiconductor substrate, forming a conductive material to surround a lower lateral surface of each pillar, forming a first spacer to surround a lateral surface of the pillar over the conductive material to expose a top surface and an upper lateral surface of the pillar, forming a self-aligned silicide (salicide) layer on the top surface and the upper lateral surface of the pillar, and forming an electrode to surround the salicide layer.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments of the present invention will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

Hereinafter, a PCRAM device will be described as a semiconductor device in the embodiment. However, it would have been obvious by those skilled in the art that the inventive concept may be applied to all nonvolatile memory devices using a resistive material such as resistive RAM (RRAM) or a ferroelectric RAM (FRAM).

Figure 2:
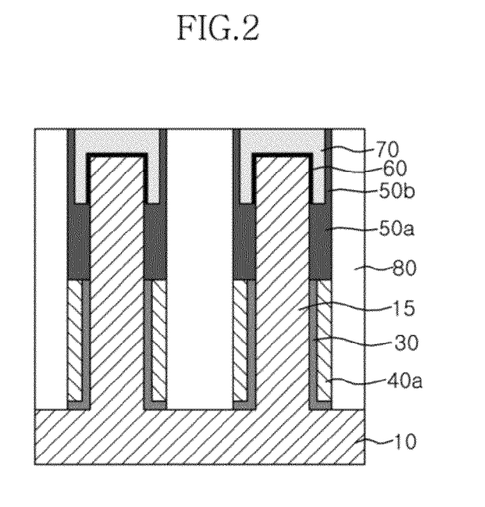
FIG. 2 is a cross-sectional view illustrating a semiconductor device according to an embodiment of the inventive concept.

Referring to FIG. 2, a semiconductor device (a PCRAM) according to an embodiment of the inventive concept may include a vertical transistor structure.

The vertical transistor structure may include a plurality of pillars 15 protruding from a semiconductor substrate 10, a gate insulating layer 30 surrounding a lower lateral surface of each pillar 15, and a gate electrode 40a surrounding the pillar 15 surrounded with the gate insulating layer 30 with a predetermined height.

As illustrated in FIG. 2, a salicide layer 60 is formed on an upper end of the vertical transistor structure, that is, on a top surface and an upper lateral surface of the pillar 15. The salicide layer 60 covers the top surface of the pillar 15 and surrounds the upper portion of the pillar 15. It can be seen that a surface area of the salicide layer 60 is increased as compared with a salicide layer in the related art formed only on the top surface of the pillar.

An electrode 70 is formed on a top surface and a lateral surface of the salicide layer 60 to cover the salicide layer 60.

The reference numerals 50a and 50b are spacers surrounding a lateral surface of the pillar between the gate electrode 40a and an electrode 70 and a lateral surface of the electrode 70.

The reference numeral 80 denotes an intercell insulating layer.

That is, in the salicide layer 80 according to the embodiment of the inventive concept, a contact area with the electrode 70 is increased by the area of the upper lateral surface of the pillar 15, i.e., the circumference of the upper end of the pillar 15, as compared in the related art, and thus a contact resistance with the electrode 70 may be reduced. With the reduction in the contact resistance with the electrode 70, ON current may be increased.

Hereinafter, a method for fabricating a semiconductor device according to an embodiment of the inventive concept will be described with reference to FIGS. 3A to 3J.

Figure 3A:
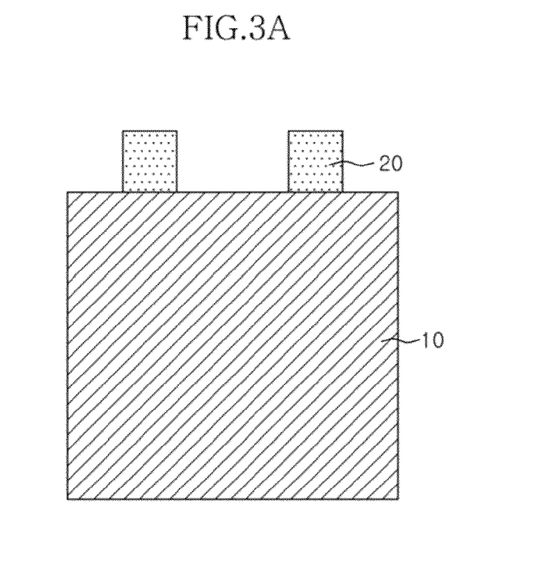
FIGS. 3A to 3J are cross-sectional views illustrating a method for fabricating a semiconductor device according to an embodiment of the inventive concept.

As illustrated in FIG. 3A, a hard mask layer (not shown) is deposited on a semiconductor substrate 10. The hard mask layer may be formed of a material having high etch selectivity compared to the semiconductor substrate 10, for example, a silicon oxide layer. A photoresist pattern (not shown) is formed on the hard mask layer through a general process, and the hard mask layer is etched using the photoresist pattern as a mask to form a hard mask pattern 20.

Figure 3B:
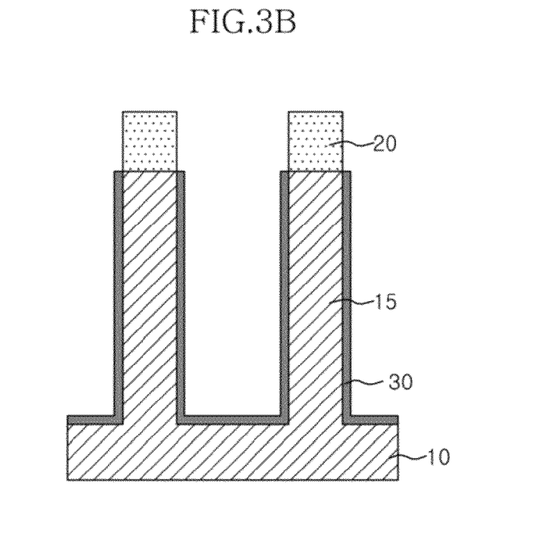

As illustrated in FIG. 3B, the semiconductor substrate 10 is etched to a predetermined depth using the hard mask pattern 20 as a mask to form a plurality of pillars 15 in the semiconductor substrate 10. The plurality of pillars 15 may be formed to extend in a perpendicular direction from the semiconductor substrate 10.

A gate insulating layer 30 is formed on the semiconductor substrate 10 including the plurality of pillars 15, that is, on exposed lateral surfaces of each pillar 15, and an exposed surface of the semiconductor substrate 10 between the pillars. For example, the gate insulating layer 30 may include a silicon oxide ($SiO_2$) layer, a hafnium oxide ($HfO_2$) layer, a tantalum oxide ($Ta_2O_5$) layer, or an oxide/nitride/oxide (ONO) layer.

Impurities may be implanted into the semiconductor substrate 10 in which the pillars 15 and the gate insulating layer 30 are formed to form a source region (not shown).

Figure 3C:
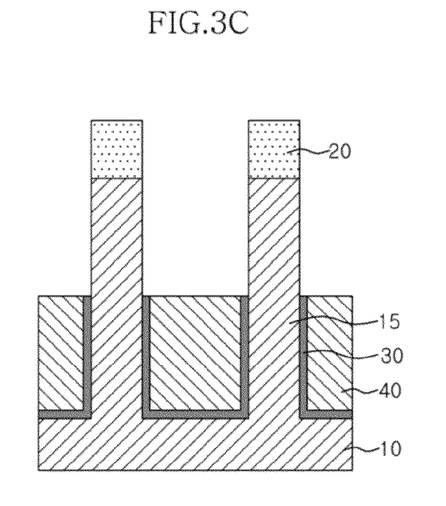

As illustrated in FIG. 3C, a conductive layer 40 is gap-filled in the semiconductor substrate including the gate insulating layer 30 as illustrated in FIG. 3B, and then etched back so that the gap-filled conductive material 40 has a predetermined height. In the etching back process, the gate insulating layer 30 may be etched back to have the same height as the gap-filled conductive material 40.

Figure 3D:
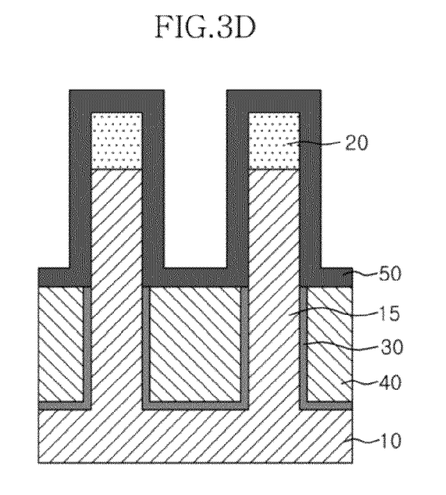

As illustrated in FIG. 3D, a spacer material 50 is deposited on the semiconductor substrate including the conductive material 40 as illustrated in FIG. 3C. The spacer material 50 may be formed using a layer having high etch selectivity compared to the semiconductor substrate 10, for example, a nitride layer.

Figure 3E:
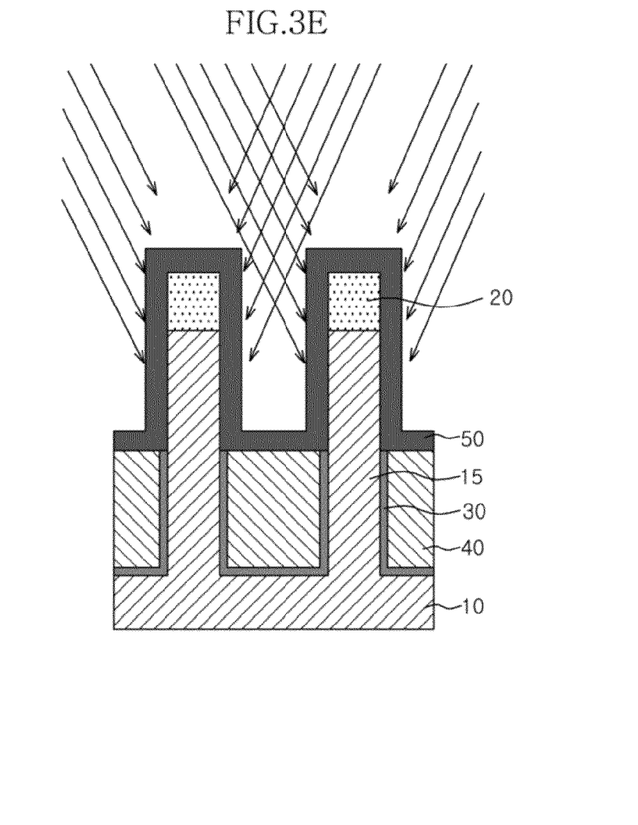

As illustrated in FIG. 3E, impurities are doped/implanted into the hard mask pattern 20 and an upper portion of the spacer material 50. The doping of the impurities may be performed through tilt angle ion implantation.

That is, depending on an ion implantation angle in the tilt angle ion implantation process, the impurities are doped only into a top surface and an upper lateral surface of the spacer material 50, and the impurities are not doped into in a lower lateral surface of the spacer material 50.

In other words, as an etch rate of the upper portion of the spacer material 50 in which the impurities are doped through the tilt angle ion implantation is increased, the upper portion of the spacer material 50 has a different etch rate from a lower portion thereof.

In the hard mask pattern 20 of the embodiment, crystallinity of a material may be modified by the doping of the impurities, and etching characteristics of the material may be changed depending on the modified crystallinity of the material in a subsequent process.

Figure 3F:
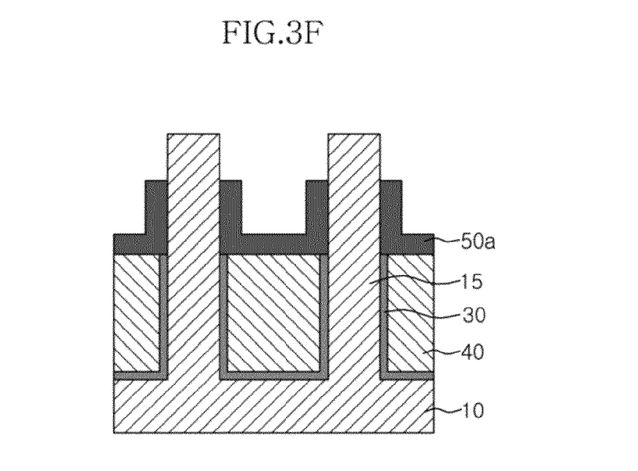

As illustrated in FIG. 3F, the hard mask pattern 20 and the upper portion of the spacer material 50, into which the impurities are doped in the above-described process, are removed to expose a top surface and an upper lateral surface of the pillar 15. The removal of the upper portion of the spacer material 50 and the hard mask pattern 20, into which the impurities are doped, may be performed through a dry etching process or a wet etching process.

A remaining spacer material 50a into which the impurities are not doped has a different etch rate from the upper portion of the spacer material 50 in which the impurities are doped, and thus the remaining spacer material 50a may not be removed when the dry etching process or the wet etching process is performed.

Impurities may be doped into the upper end of the pillar 15 exposed by removing the upper portion of the spacer material 50 and the hard mask pattern 20 to form a drain region (not shown).

Figure 3G:
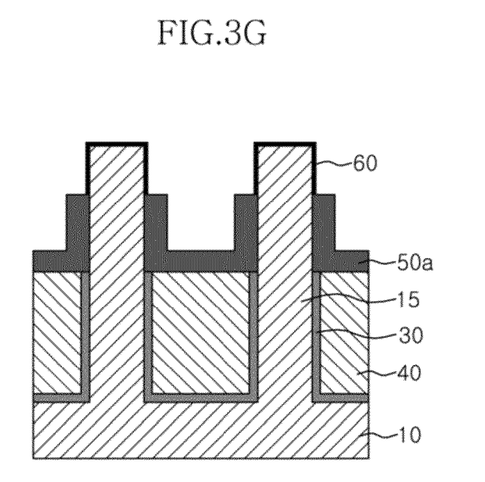

As illustrated in FIG. 3G, a salicide layer 60 is formed on the upper lateral surface of the pillar 15 and the top surface of the pillar 15, exposed through the removal process.

Specifically, a silicide formation material (not shown) is deposited on the semiconductor substrate from which the hard mask pattern 20 and the upper portion of the spacer material 50 are removed as illustrated in FIG. 3F. The silicide formation material may include a transition metal layer such as cobalt (Co), titanium (Ti), nickel (Ni), or tungsten (W).

A heat treatment may be performed to allow the pillar 15 to react with the silicide formation material. The reaction occurs in a direct contact portion of the silicide formation material with the pillar 15 so that a self-aligned silicide layer, that is, the salicide layer 60 is formed through selective reaction between silicon and metal.

A portion of the silicide formation material, which is not transformed into the salicide layer 60, is removed through a general method. In other words, in the embodiment, the salicide layer 60 is formed to cover the top surface of the pillar 15 and the upper lateral surface of the pillar 15.

Figure 3H:
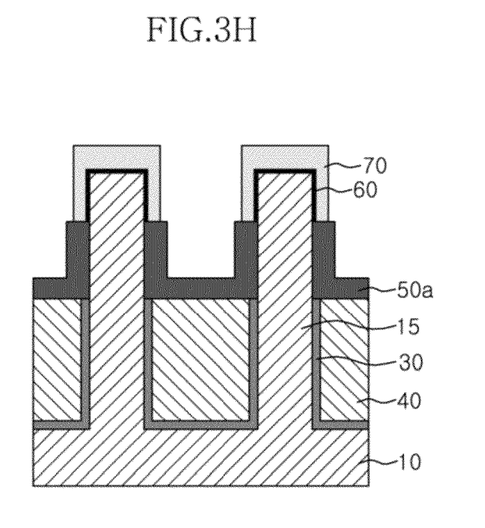

As illustrated in FIG. 3H, an electrode 70 is formed on the pillar 15 on which the salicide layer 60 is formed. The electrode 70 may be formed to cover a top surface and a lateral surface of the salicide layer 60.

The conductive layer for the electrode 70 may include a material such as titanium nitride (TiN), tantalum nitride (TaN), tungsten nitride (WN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium (Ti), tungsten (W), molybdenum (Mo), tantalum (Ta), titanium silicide (TiSi), tantalum silicide (TaSi), titanium oxynitride (TiON), titanium aluminum oxynitride (TiAlON), tungsten oxynitride (WON), or tantalum oxynitride (TaON).

Figure 3I:
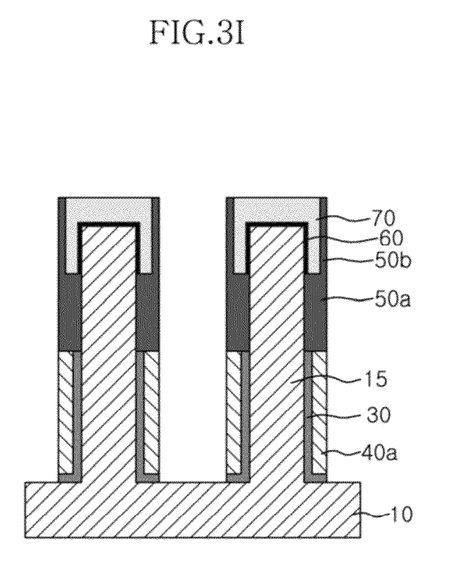

As illustrated in FIG. 3I, a spacer material is deposited on the semiconductor substrate including the electrode 70 as illustrated in FIG. 3H, and then spacer-etched to form a spacer 50b. Through the spacer-etching process, a top surface of the electrode 70 is exposed, and a lateral surface of the electrode 70 is surrounded with the spacer 50b.

The conductive material (see 40 of FIG. 3C) between the spacers 50a is etched so that a gate electrode 40a is formed in a form to surround a lower portion of the pillar 15.

Figure 3J:
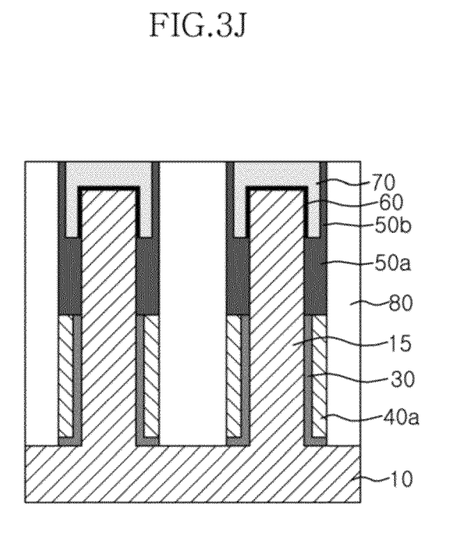

As illustrated in FIG. 3J, an insulating material is gap-filled in the semiconductor substrate including the spacer 50b as illustrated in FIG. 3I, and then planarized to form an intercell insulating layer 80 until the top surface of the electrode 70 is exposed. A phase-change layer (not shown) and another electrode (not shown) are formed on the electrode 70 to complete the PCRAM device.

Hereinafter, a method for manufacturing a semiconductor device according to another embodiment of the inventive concept will be described with reference to FIG. 4A to 4J.

Figure 4A:
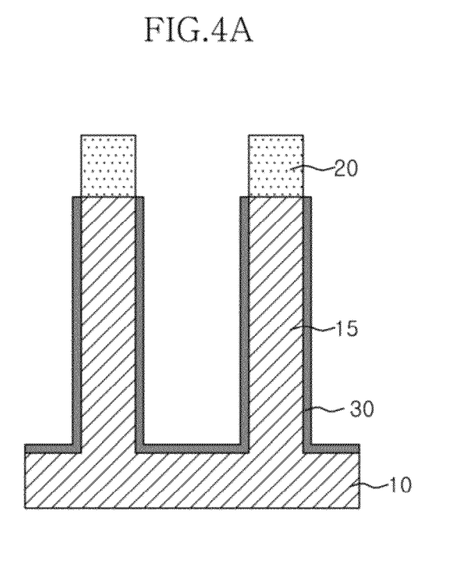
FIGS. 4A to 4J are cross-sectional views illustrating a method for fabricating a semiconductor device according to another embodiment of the inventive concept.

As illustrated in FIG. 4A, a hard mask pattern 20 is formed on a semiconductor substrate 10, and the semiconductor substrate 10 is etched to a predetermined depth using the hard mask pattern 20 as a mask to form a plurality of pillars 15. A gate insulating layer 30 is formed on the semiconductor substrate 10 including the plurality of pillars 15, that is, on exposed lateral surfaces of each pillar 15 and an exposed surface of the semiconductor substrate 10 between the pillars 15.

Figure 4B:
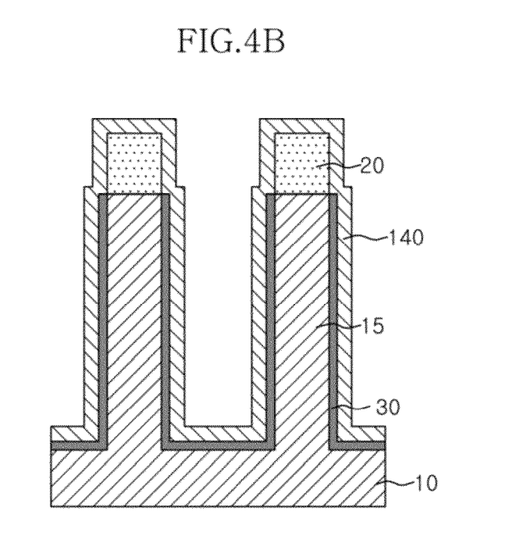

As illustrated in FIG. 4B, a conductive material 140 is deposited on the semiconductor substrate including the gate insulating layer 30 as illustrated in FIG. 4A. The conductive material 140 may include a material such as TiN, TaN, WN, NbN, TiSiN, TiAlN, TiBN, ZrSiN, WSiN, WBN, ZrAlN, MoAlN, TaSiN, TaAlN, Ti, W, Mo, Ta, TiSi, TaSi, TiON, TiAlON, WON, or TaON.

Figure 4C:
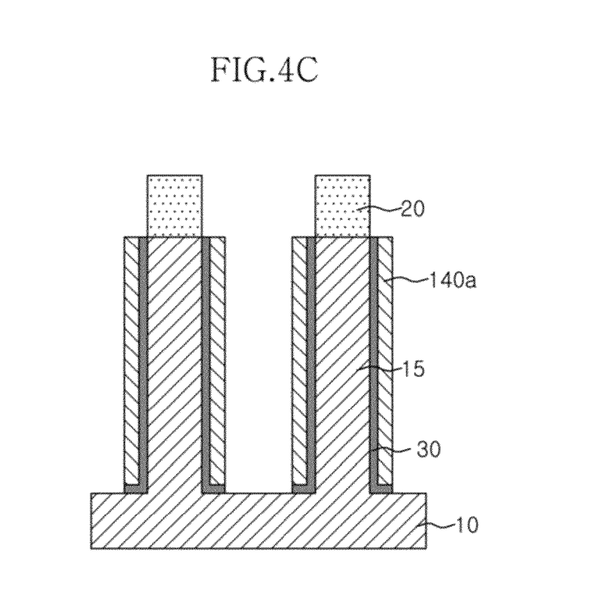

As illustrated in FIG. 4C, a conductive material (see 140 of FIG. 4B) is spacer-etched. Therefore, the conductive material 140a remains in a form to surround a lateral surface of the pillar 15.

Figure 4D:
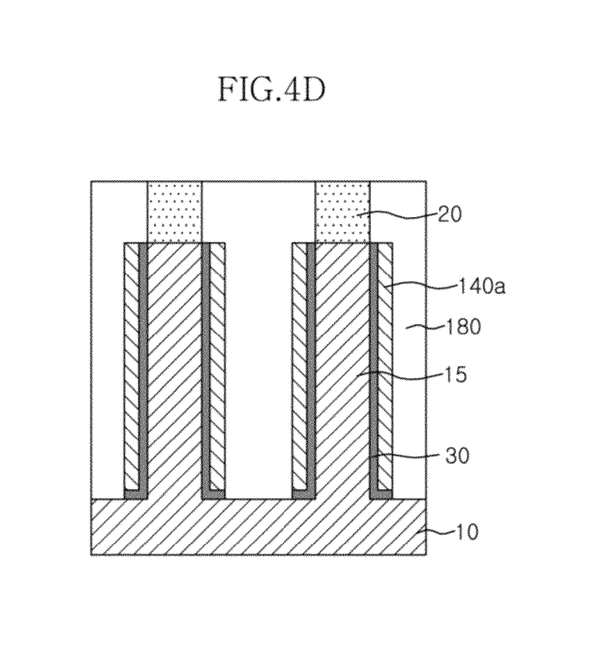

As illustrated in FIG. 4D, an insulating material is gap-filled in the semiconductor substrate including the conductive material 140a as illustrated in FIG. 4C, and then planarized to form an intercell insulation layer 180 until a top surface of the hard mask pattern 20 is exposed.

Figure 4E:
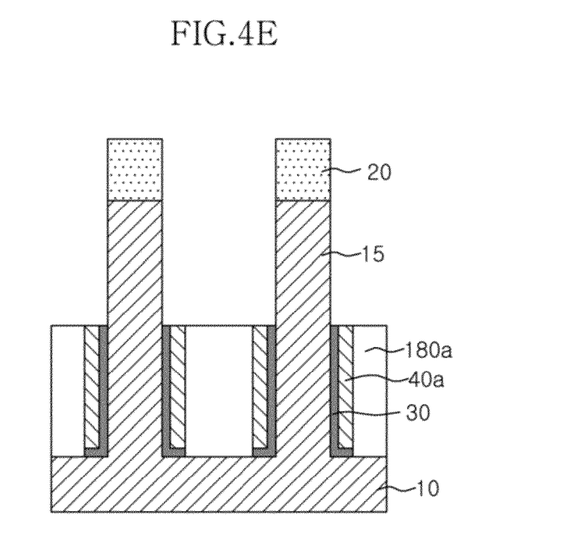

As illustrated in FIG. 4E, the gate insulating layer 30, the conductive material 140a, and the intercell insulating layer 180 are recessed or etched back. Therefore, the gate insulating layer 30, a gate electrode 40a, and the intercell insulating layer 180a are formed to have a predetermined height.

Figure 4F:
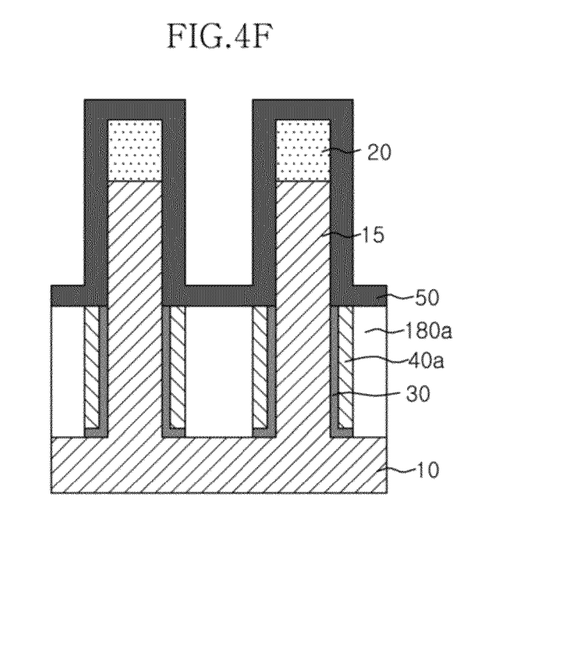

As illustrated in FIG. 4F, a spacer material 50 is deposited on the semiconductor substrate including the recessed gate insulation layer 30, gate electrode 40a, and intercell insulating layer 180a as illustrated in FIG. 4E. The spacer material 50 may be formed using a material having high etch selectivity compared to the semiconductor substrate 10, for example, a nitride material.

Figure 4G:
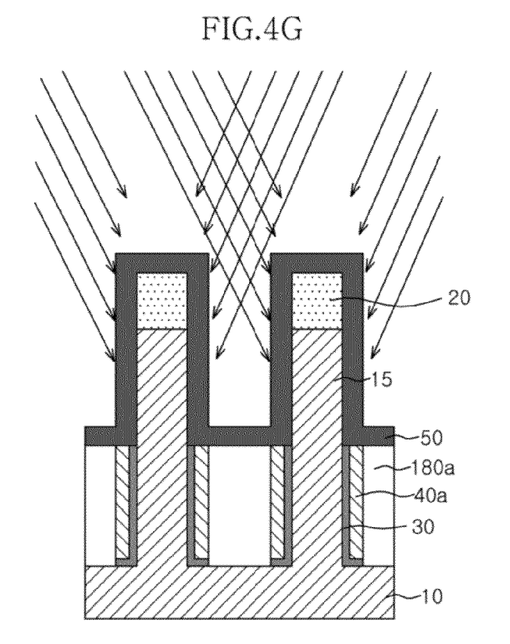

As illustrated in FIG. 4G, impurities are doped into an upper portion of the spacer material 50 and the hard mask pattern 20. The impurity doping may be performed through tilt angle ion implantation.

That is, depending on an ion implantation angle in the tilt angle ion implantation process, the impurities are doped only into a top surface and an upper lateral surface of the spacer material 50, and the impurities are not doped in a lower lateral surface of the spacer material 50. Therefore, in the embodiment, as an etch rate of the upper portion of the spacer material 50 in which the impurities are doped through the tilt angel ion implantation is increased, the upper portion of the spacer material 50 has a different etch rate from the lower portion thereof.

In the hard mask pattern 20, crystallinity of a material may be modified by the doping of the impurities, and etching characteristics of the material may be changed depending on the modified crystallinity of the material in a subsequent process.

Figure 4H:
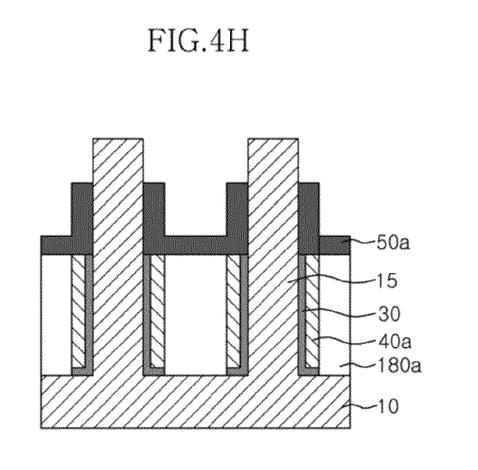

As illustrated in FIG. 4H, the hard mask pattern 20 and the upper portion of the spacer material 50, into which the impurities are doped, are removed to expose a top surface of the pillar 15 and an upper lateral surface of the pillar 15. The removal of the upper portion of the spacer material 50 and the hard mask pattern 20 may be performed through a dry etching process or a wet etching process A remaining spacer material 50a into which the impurities are not doped has a different etch rate from the upper portion of the spacer material 50 in which the impurities are doped, and thus the remaining spacer material 50a may not be removed in the dry etching process or the wet etching process.

Since the crystallinity of the impurity-doped hard mask patter 20 is changed, the impurity-doped hard mask patter 20 may be easily removed when an etching process suitable for the modified crystallinity is performed.

Further, although not shown, the spacer material 50a may be spacer-etched.

Figure 4I:
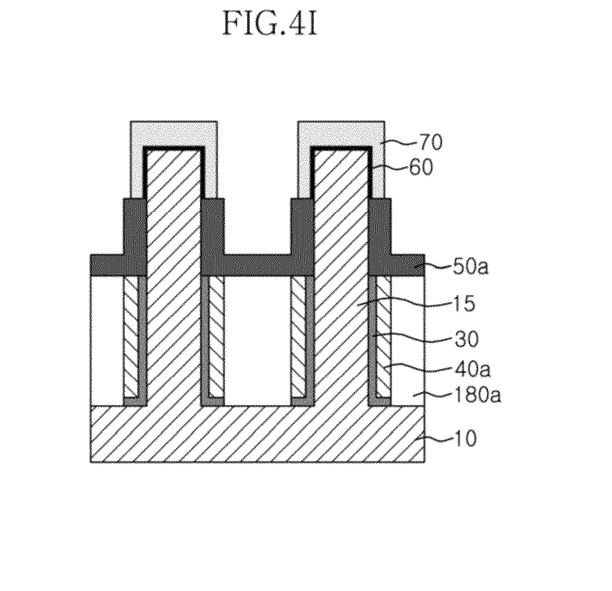

As illustrated in FIG. 4I, a salicide layer 60 is formed on the upper lateral surface of the pillar 15 and the top surface of the pillar 15, exposed through the above-described removal process. An electrode 70 is formed to cover a top surface and a lateral surface of the salicide layer 60.

Figure 4J:
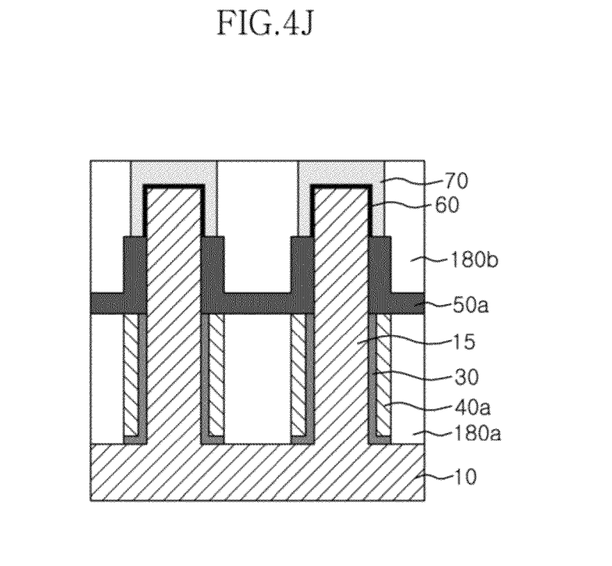

As illustrated in FIG. 4J, an insulating material is gap-filled in the semiconductor substrate including the spacer 50a as illustrated in FIG. 4I, and then planarized to form an intercell insulating layer 180b until the top surface of the electrode 70 is exposed. The intercell insulating layer 180b may be formed of the same material as or a similar material to the intercell insulation layer 180a.

In the PCRAM device fabricated through the above-described method, a salicide layer between a pillar and an electrode is formed on a top surface of the pillar and an upper lateral surface of the pillar. Therefore, it can be seen that a surface area of the salicide layer is increased as compared in the relater art. Accordingly, a contact area of the salicide layer with an electrode is increased, and thus a contact resistance with the electrode is reduced.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for fabricating a semiconductor device, the method comprising:
    forming a plurality of pillars in the semiconductor substrate;
    forming a conductive material to surround a lower lateral surface of each pillar;
    forming a first spacer to surround a lateral surface of the pillar over the conductive material to expose a top surface and an upper lateral surface of the pillar;
    forming a self-aligned silicide (salicide) layer on the top surface and the upper lateral surface of the pillar; and
    forming an electrode to surround the salicide layer,
    wherein the forming of the first spacer includes;
    forming a first spacer material along a surface of the conductive material and the pillar;
    doping impurities into a top surface and an upper lateral surface of the first spacer material, wherein the impurity-doped portion of the first spacer material has a different etch rate from the other portion of the first spacer material; and
    removing an impurity-doped portion of the first spacer material into which the impurities are doped to expose the top surface and the upper lateral surface of the pillar.

2. The method of claim 1, wherein the forming of the plurality of pillars includes:
    forming a hard mask pattern on the semiconductor substrate; and
    forming the plurality of pillars by etching the semiconductor substrate to a set depth in a form of the hard mask pattern.

3. The method of claim 2, wherein the doping of the impurities includes doping the impurities into the hard mask pattern to modify crystallinity of the hard mask pattern.

4. The method of claim 3, wherein the removing of the impurity-doped portion of the first spacer material includes removing the hard mask pattern doped with the impurities.

5. The method of claim 1, wherein the doping of the impurities includes performing ion implantation on the first spacer material at a set angle.

6. The method of claim 1, wherein the forming of the conductive material includes:
    gap-filling a conductive layer between the pillars in the semiconductor substrate; and
    performing an etch back on the conductive layer to form the conductive material.

7. The method of claim 6, further comprising, after the forming of the electrode:
    forming a second spacer material on the semiconductor substrate including the electrode, and spacer-etching the second spacer material; and
    removing the conductive material between etched second spacer materials.

8. The method of claim 7, further comprising, after the removing of the conductive material;
    gap-filling an insulating material in the semiconductor substrate; and
    planarizing the insulating material until the electrode is exposed to form an intercell insulating layer.

9. The method of claim 1, wherein the forming of the conductive material includes:
    forming a conductive layer on the semiconductor substrate including the pillar, and spacer-etching the conductive layer; and
    gap-filling a first insulating material in the semiconductor substrate, and planarizing the first insulating material;
    performing an etch back on the conductive layer and the first insulating layer to form the conductive material and a first intercell insulating layer.

10. The method of claim 9, further comprising, after the forming of the electrode:
    gap-filling a second insulating material in the semiconductor substrate; and
    planarizing the second insulating material until the electrode is exposed to form a second intercell insulating layer.

* * * * *